United States Patent
Zucker et al.

(10) Patent No.: US 9,077,144 B2
(45) Date of Patent: Jul. 7, 2015

(54) MOPA LASER SOURCE WITH WAVELENGTH CONTROL

(71) Applicant: JDS Uniphase Corporation, Milpitas, CA (US)

(72) Inventors: Erik Paul Zucker, Los Altos, CA (US); Victor Rossin, Mountain View, CA (US); Pierre Doussiere, San Jose, CA (US)

(73) Assignee: JDS Uniphase Corporation, Milpitas, CA (US)

(*) Notice: Subject to any disclaimer, the term of this patent is extended or adjusted under 35 U.S.C. 154(b) by 0 days.

(21) Appl. No.: 14/042,017

(22) Filed: Sep. 30, 2013

(65) Prior Publication Data

US 2015/0092800 A1     Apr. 2, 2015

(51) Int. Cl.
*H01S 3/13*     (2006.01)
*H01S 5/068*    (2006.01)
*H01S 5/024*    (2006.01)

(52) U.S. Cl.
CPC ......... *H01S 5/06808* (2013.01); *H01S 5/02453* (2013.01)

(58) Field of Classification Search
CPC ............ H01S 3/10015; H01S 3/10007; H01S 3/2375; H01S 3/0085; H01S 3/1055; H01S 5/026; H01S 5/12; H01S 2302/00; H01S 5/187; H01S 3/2308; H01S 5/18; H01S 5/00; H01S 5/02248; H01S 5/06213; H01S 5/1228; H01S 5/1237; H01S 5/125
USPC ........... 372/29.015, 50.1, 50.11, 43.01, 50.22
See application file for complete search history.

(56) References Cited

U.S. PATENT DOCUMENTS

| | | | |
|---|---|---|---|
| 4,744,089 A | 5/1988 | Montroll et al. | 372/50.22 |
| 5,175,643 A * | 12/1992 | Andrews | 359/339 |
| 5,349,602 A | 9/1994 | Mehuys et al. | 372/98 |
| 5,440,576 A | 8/1995 | Welch et al. | 372/50.22 |
| 5,537,432 A | 7/1996 | Mehuys et al. | 372/50.11 |
| 5,539,571 A | 7/1996 | Welch et al. | 359/344 |
| 5,539,759 A | 7/1996 | Chang-Hasnain et al. | 372/19 |

(Continued)

FOREIGN PATENT DOCUMENTS

| | | | | |
|---|---|---|---|---|
| JP | 2544410 B2 | 5/1989 | | H01S 5/06 |
| JP | 2003110194 A | 4/2003 | | G02F 1/35 |

OTHER PUBLICATIONS

Ward et al, "Widely Tunable DS-DBR Laser With Monolithically Integrated SOA: Design and Performance", IEEE Journal of Selected Topics in Quantum Electronics, Vol. 11, No. 1, pp. 149-156, Jan./Feb. 2005.

(Continued)

*Primary Examiner* — Tod T Van Roy
*Assistant Examiner* — Delma R Forde
(74) *Attorney, Agent, or Firm* — JDS Uniphase Corporation

(57) ABSTRACT

The invention provides a wavelength-controlled pump MOPA laser and a method of operation thereof. A monolithic semiconductor MOPA laser chip has a DFB-laser based MO (master oscillator) and PA (power amplifier) sections formed in a same monolithic waveguide, and separate MO and PA electrodes for individual control of current injection into the MO and PA sections. The laser wavelength is defined by the DFB grating and is kept fixed by suitably controlling the MO current to compensate for a thermal crosstalk from the PA section, or tuned by suitably changing the MO current or direct heating of the DFB region.

17 Claims, 11 Drawing Sheets

(56) References Cited

U.S. PATENT DOCUMENTS

| | | | |
|---|---|---|---|
| 5,651,018 A | 7/1997 | Mehuys et al. | 372/50.1 |
| 6,816,531 B1 | 11/2004 | Rossin et al. | 372/64 |
| 7,709,280 B2 | 5/2010 | Yang | 438/22 |
| 2013/0107900 A1* | 5/2013 | Hayakawa | 372/36 |

OTHER PUBLICATIONS

Harder et al, "High-power ridge-waveguide AlGaAs GRIN-SCH laser diode", Electronics Letters, vol. 22, No. 20, pp. 1081-1082, Sep. 25, 1986.

Tsukiji et al, "Recent progress of high power 14XXnm pump lasers", SPIE IT com on Active and Passive Optical Components for WDM Communication, Denver, Colorado, SPIE Proceedings, vol. 4532, pp. 349-360, 2001.

Sahm et al., "4.5 W Hybrid Integrated Master-Oscillator Power-Amplifier at 976 nm on Micro-Optical Bench", Photonics Packaging, Integration, and Interconnects IX., Edited by Glebov, Alexei L.; Chen, Ray T.. Proceedings of the SPIE, vol. 7221 (2009)., article id. 72210W, 7 pages, 2009.

"Tapered Laser with Integrated Gratings", Ferdinand-Braun-Institut, http://www.fbh-berlin.com/business-areas/diode-lasers/high-brightness-lasers/tapered-laser-with-integrated-gratings, Aug. 21, 2013.

Hansen et al, "All semiconductor laser Doppler anemometer at 1.55μm", Optics Express 18288, vol. 16, No. 22, Oct. 27, 2008.

Spießberger et al, "Micro-integrated 1Watt semiconductor laser system with a linewidth of 3.6 kHz", Optics Express 7077, vol. 19, No. 8, Apr. 11, 2011.

* cited by examiner

MOPA LASER SOURCE WITH WAVELENGTH CONTROL

TECHNICAL FIELD

The present invention generally relates to high-power semiconductor laser devices, and more particularly relates to high-power integrated master oscillator-power amplifier (MOPA) laser pump sources with independent control of wavelength and output optical power.

BACKGROUND OF THE INVENTION

High-power semiconductor lasers are commonly used as optical pump source for pumping of optical amplifier, such as but not exclusively Erbium doped fiber amplifiers (EDFA) and optical fiber based Raman amplifiers. In order to be useful as an optical amplifier pump source, semiconductor laser pumps need to maintain a fixed lasing wavelength with variations in temperature, drive current and/or output power of the laser. For both "980 nm pump lasers" and "Raman pump lasers", the wavelength is typically stabilized by an external fiber Bragg grating (FBG). FIG. 1 illustrates a typical configuration of a prior art semiconductor laser-based pump source 5 for pumping fiber-optic amplifiers. In this configuration, an output facet 12 of a Fabry-Perot type semiconductor laser 10 is coupled to an optical fiber pigtail 20 having a lensed proximal end, which includes an FBG 22 that is formed within the fiber at some distance along its length from the lensed laser-coupled proximal end of the fiber pigtail 20, typically from a few centimeters to about a meter. A back facet 11 of the laser 10 typically has a high-reflection HR coating, while the output facet 12 has a low-reflection (AR) coating to reduce, but typically not eliminate, reflection of the laser light 31 generated within the laser cavity back into the laser 10. The FBG 22 reflects a relatively small portion 35 of the output laser light 33 back into the laser 10 to provide a wavelength stabilization, with light 37 transmitted through the FBG forming the useful output of the laser pump device 5. Typically, the FBG 22 stabilizes or fixes the optical spectrum of the pump 5 at or near the Bragg wavelength of the FBG 22 within a few tenths of a nanometer.

However, this arrangement has certain drawbacks, which include the added cost of forming an FBG within the fiber pigtail of the pump, a limited effectiveness of the wavelength stabilization using the distant FBG, a dependence of the stabilization on the laser to fiber coupling efficiency, and added optical loss.

Therefore, it would be beneficial to provide a semiconductor laser-based wavelength-stabilized source of high-power optical radiation that does not require an external FBG for the wavelength stabilization.

SUMMARY OF THE INVENTION

Accordingly, an aspect of the present provides a master oscillator-power amplifier (MOPA) device, which comprises a monolithic MOPA chip comprising a semiconductor substrate and at least one MOPA structure formed upon the substrate. The at least one MOPA structure comprises: a master oscillator (MO) section comprising a single spatial mode DFB laser structure for generating laser light, the single spatial mode DFB laser structure comprising a Bragg grating for providing a distributed optical feedback therein and for defining a laser wavelength; and, a power amplifier (PA) section comprising a semiconductor amplifier structure optically following the single spatial mode DFB laser structure and integrally coupled thereto for amplifying the laser light and for providing output light in a single spatial mode, the PA section comprising a second electrical contact for electrically pumping the single spatial mode semiconductor amplifier structure. The MO and PA sections comprise first and second electrical contacts, respectively, which are electrically separate from each other for separately pumping the MO and PA sections of the MOPA device with individually controllable first and second electrical currents.

According to one aspect of the present invention, the MOPA device further includes a MOPA driver that is electrically connected to the first and second electrical contacts for driving the first electrical current through the MO section and the second electrical current through the PA section to initiate lasing in the MO section at the laser wavelength while providing optical amplification in the PA section. The MOPA driver comprises a controller configured for varying one of the first and second electrical currents in dependence upon the other of the first and second electrical currents so as to control one of an optical power and the laser wavelength constant when the other of the optical power of the output light or the laser wavelength is varied.

Another aspect of the present invention provides a method of controlling the wavelength of a monolithic MOPA device comprising a DFB laser master oscillator (MO) section optically coupled to a single-spatial-mode power amplifier (PA) section and having separate electrical contacts in MO and PA sections enabling separate control of electrical current injection into the MO and PA sections of the MOPA device, wherein the MO and PA sections are in thermal contact with each other. The method comprises: a) providing a first electrical current through the MO electrical contact to generate light in the MO section at a laser wavelength; b) providing a second electrical current through the PA electrical contact for amplifying the light passing through the PA section; and, c) varying one of the first and second electrical currents in dependence upon the other of the first and second electrical currents so as to maintain constant one of an output optical power of the PA section and the laser wavelength when the other of the output optical power and the laser wavelength is varied.

Step (c) may comprise simultaneously varying the first and second electrical currents in opposite directions so that when the second current through the PA section is increased for increasing the output optical power, the first electrical current through the MO section is decreased for compensating the effect of the increased second current on a temperature in a DFB region of the MO section due to a thermal crosstalk from the PA section 130 into the DFB region of the MA section 120, so as to maintain the laser wavelength constant while the output optical power is varied.

The method may also comprise i) providing a controller electrically connected to the MO and PA sections of the MOPA device for controlling the first and second electrical currents, the controller comprising a computer-readable memory storing a look-up table containing values of the first and second electrical currents for a plurality of laser wavelength values and one or more output power values; and, iii) responsive to a wavelength request signal, adjusting the first and second electrical currents to tune the laser wavelength to a requested wavelength value using the look-up table.

Where alternative embodiments and additional aspects of those embodiments are described in the present disclosure, these embodiments and aspects may be combined in any manner within a single embodiment unless the present disclosure suggests otherwise. While preferred embodiments may be illustrated or described herein, they are not intended to limit the invention. Rather, numerous changes including alternatives, modifications and equivalents may be made as would be understood by the person skilled in the art.

BRIEF DESCRIPTION OF THE DRAWINGS

The invention will be described in greater detail with reference to the accompanying drawings which represent preferred embodiments thereof, in which like elements are indicated with like reference numerals, and wherein.

DETAILED DESCRIPTION

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention.

Note that as used herein, the terms "first", "second" and so forth are not intended to imply sequential ordering, but rather are intended to distinguish one element from another unless explicitly stated.

Figure 2:
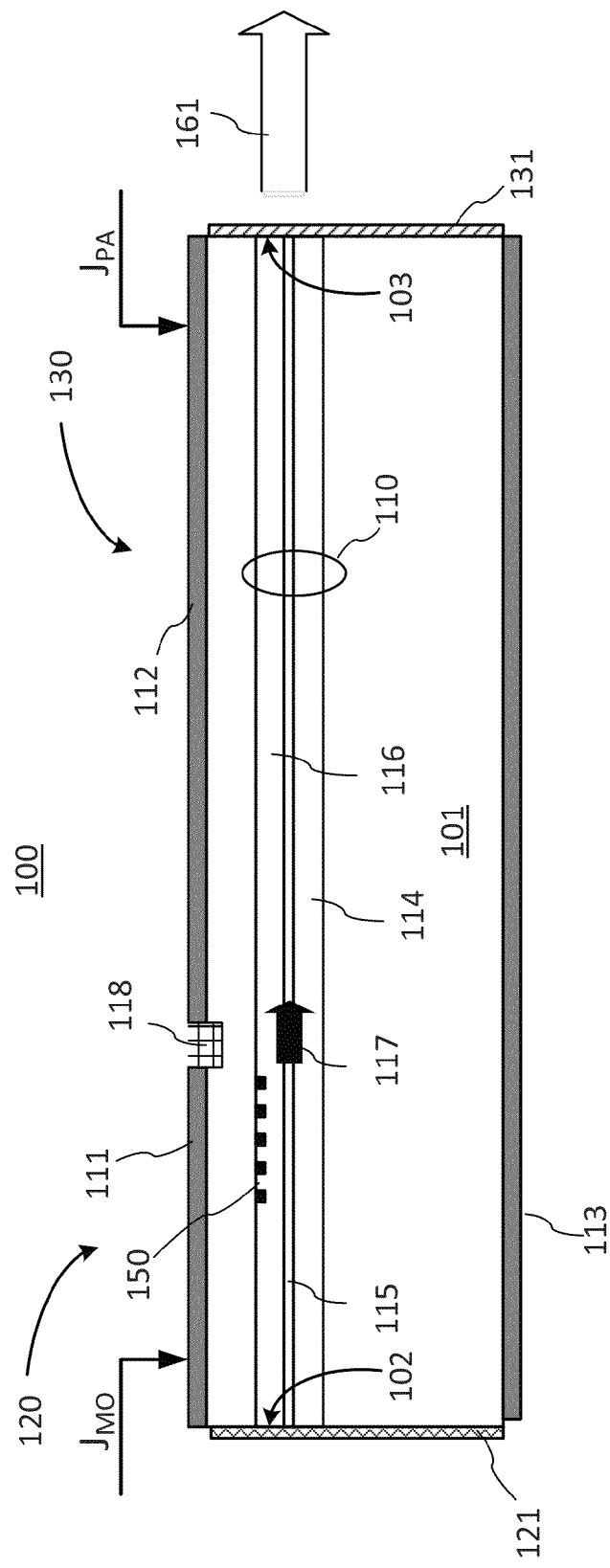
FIG. 2 is a schematic side view of one embodiment of a monolithic DFB MOPA laser according to the present disclosure.
Figure 3:
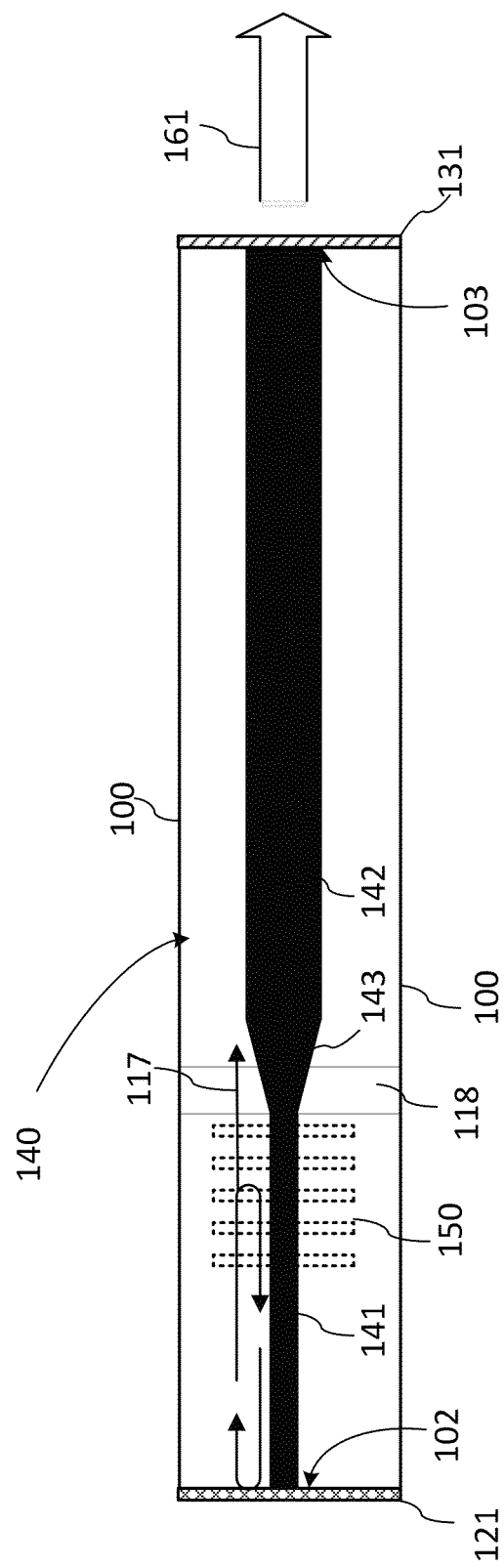
FIG. 3 is a plan view of the monolithic DFB MOPA laser of FIG. 2.
Figure 4:
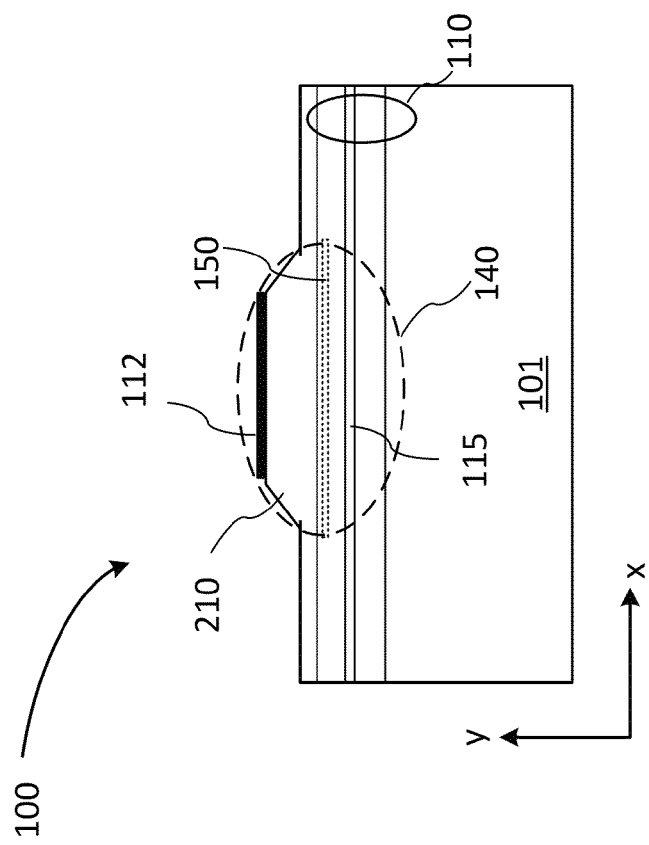
FIG. 4 is a an output facet view of the monolithic DFB MOPA laser of FIG. 2.

With reference to FIGS. 2-4, a monolithic master oscillator-power amplifier (MOPA) laser 100 is embodied in a single semiconductor chip and includes a master oscillator (MO) section 120 that is optically followed by a power amplifier (PA) section 130, with both the MO and PA sections 120, 130 sharing a same semiconductor substrate 101. The MOPA laser 100 may also be referred to as the DFB MOPA laser 100 or simply as the DFB MOPA 100. The MO section 120 is preferably in the form of a single spatial mode (SSM) distributed feedback (DFB) laser structure, and includes a distributed Bragg grating 150 providing a frequency-selective distributed feedback for the MO section, as generally known in the art for DFB lasers. The Bragg grating 150 is also referred to herein as the DFB grating. An electrical contact 111, which is also referred to herein as the first metal contact 111 or the MO contact 111, is further provided in the MO section for electrically pumping the DFB laser structure underneath it to generate laser light 117 in a single spatial mode. The electrical contact 111 may be in the form of a metal stripe extending length-wise on top of the MO section 120.

The PA section 130 is formed with a single spatial mode semiconductor amplifier structure that is disposed upon the substrate 101 to receive and amplify the laser light 117 from the MO section 120. The PA section 130 includes a second electrical contact 112, which is also referred to herein as the PA contact 112, for electrically pumping the PA section 130 to amplify the laser light 117 propagating therethrough. The amplified laser light 117 is outputted from the distal end of the PA section in the form of output MOPA light 161, also preferably in a single spatial mode. The term 'spatial mode', as used herein, relates to the distribution of the optical field of the light in a plane normal to the light propagation, e.g. in the (x,y) plane of FIG. 4, and encompasses so-called lateral modes, i.e. in the 'x' direction along the substrate, and transverse modes, i.e. in the 'y' direction normal to the main plane of the substrate and to the waveguiding layers 114-116. A laser or amplifier structure is said to be "single spatial mode" if it is designed so that most of the optical power of its output light, e.g. more than 95%, is concentrated within a single spatial mode.

The first and second electrical contacts 111, 112 are physically and electrically separated from each other by an electrode gap 118 for separately pumping the MO and PA sections 120, 130 of the DFB MOPA laser 100 with first and second electrical currents $J_{MO}$ and $J_{PA}$, respectively, as described hereinbelow more in detail. In one embodiment, the electrode gap 118 may extend into the semiconductor layer or layers of the device for improved electrical isolation and reduced current crosstalk between the MO and PA sections, and may be filled with a suitable non-conducting material as known in the art of semiconductor devices, such as silicon dioxide, silicon nitride, any other suitable dielectric, or air. By way of example, the electrode gap 118 may range in width between about 1 and 20 microns. A complementary metal contact 113 is further provided at the opposite side of the substrate 101 to serve as a common second electrode for both the MO and PA sections 120, 130. It will be appreciated however that the complementary contact 113 may also be split between the MO and PA sections into two separate contacts, one for each section.

In exemplary embodiments described hereinbelow, the top semiconductor layers in both the MO and PA sections beneath the contacts 111, 112 are considered to be p-doped. Accordingly, the electrical contacts 111, 112 serve as anode electrodes, i.e. are to be driven in operation by a positive voltage, and are also referred to herein as the anode contacts or as the MO and PA anodes, respectively, with the common contact 113 referred to as the common cathode contact or cathode electrode, or simply as the common cathode. It will be appreciated however that in other embodiments the top semiconductor layers may be n-doped, and the MO and PA contacts 111, 112 are cathodes.

The semiconductor layer structure of the MO and PA sections 120, 130 of the MOPA laser 100 may be generally as known in the art of high-power pump lasers and semiconductor amplifiers, and may be based on any semiconductor layer structure that is known to provide optical amplification and lasing through current injection and optical confinement and waveguiding, such as but not limited to those based on GaAs or InP substrates. By way of example, it may be as conventionally used in commercial laser pump products, including but not limited to 980 nm pump lasers chips and Raman pump laser chips for operating in the 1.4 μm wavelength range, such as those used in S26, S27, S30, and S34 series pump lasers that are available from JDSU, or described in C. S. Harder et al, Electron. Letters 1986, vol. 22, pp 1081-1082, N. Tsukiji et al, SPIE 2001, vol. 4532, pp. 349-360, and U.S. Pat. Nos. 6,816,531 and 7,709,280, all of which are incorporated herein by reference.

In one embodiment, the MOPA laser 100 includes a common waveguide layer structure 110 that extends between opposing ends or edges 102, 103 of the MOPA chip through both the PA and MO sections 120, 130. It is composed of two cladding layers 114, 116 sandwiching an active core layer 115 therebetween, and includes a p-n or p-i-n heterojunction for creating a carrier population inversion providing an optical gain in the active core layer 115 as known in the art of semiconductor lasers and amplifiers. The waveguide layer structure 110 provides optical confinement in the vertical direction, i.e. normal to the plane of the substrate 101 and the layers 110. Although having a common semiconductor layer structure in the MO and PA sections 120, 130 is currently preferred for ease of manufacturing, embodiments wherein the waveguide layer structure 110 differs between the MO and PA sections may be envisioned and are also within the scope of the present invention.

Referring to FIGS. 3 and 4, in one embodiment the MOPA laser 100 includes a planar optical waveguide 140, which extends through the MO and PA sections 120, 130. It provides the optical continent in the lateral direction, i.e. in the direction parallel to the main substrate plane and normal to the light propagation direction, and guides the light 117 generated in the MO section 120 through the PA section 130 to an output end of the device. In a preferred embodiment, the waveguide 140 is dimensioned so that it is effectively single-mode, so that any higher-order spatial mode that it may theoretically support has an optical loss in the waveguide that is considerably higher than the optical loss of a fundamental mode, so that in operation the DFB laser of the MO section 120 lases in the single spatial mode, which then propagates to the output 103 of the waveguide 140 through the PA section 130 without converting into higher-order spatial modes. As illustrated in FIG. 4, the waveguide 140 incorporates the waveguiding layer structure 110, or a lateral portion thereof as define by the width of the waveguide 140, and may be a shallow-ridge waveguide defined by a shallow ridge 210 formed in a top layer or layers of the chip. In other embodiments, the ridge 210 may extend through one or more of the waveguiding layers 114-116. In yet other embodiments, the waveguide 140 may be of the buried-waveguide type wherein the ridge 210 is buried under additional layers of a lower-index material providing the lateral optical confinement of the spatial laser mode, as known in the art.

Although the waveguide 140 is preferably monolithic, it can be viewed as composed of a MO waveguide section 141 and the PA waveguide section 142, which are integrally butt-coupled, and both of which are dimensioned to be SSM waveguides for lateral spatial modes, meaning that they support the propagation of primarily a single lateral mode as described hereinabove, which is advantageous for efficient pumping of single spatial mode optical fibers. In the illustrated embodiment, the PA waveguide 141 is wider than MO waveguide 142 along most of its length, for providing a high output optical power while having a suitably low optical power density near the output end of the PA section that is not damaging for the device long-term performance. By way of example, the width of the MO waveguide 141 may be in the range of 2 to 5 microns (μm), while the width of the PA waveguide 142 may be in the range of 4 to 10 μm. In other embodiments, the MO and PA waveguides 141, 142 may be of substantially same width. In some embodiments, the PA waveguide 142 may somewhat increase in width towards the output end thereof, while preserving its SSM property. In one currently preferred embodiment, the width of the PA waveguide 142 at the output end thereof, i.e. near the output face 103, is about 10 μm or less. In the embodiment wherein the MO and PA waveguide portions 141, 142 differ in width, the SSM waveguide 140 may include a flared waveguide portion 143 joining the MO and PA waveguides 141, 142. In one embodiment, the flared waveguide portion 143 extends from the output end of the MO section to the output face 103 of the device, preferably not exceeding about 10 μm at the output end to provide a good coupling efficiency to a single-mode optical fiber. Further by way of example, the length of the MO waveguide 141 may be in the range of 500 microns to 1500 microns, while the length of the PA waveguide 142 may be in the range of 2000 microns to 5000 microns, although DFB MOPA devices with MO and/or PA sections with lengths outside of one or both of these respective ranges are also within the scope of the present disclosure.

In one embodiment, the DFB grating 150 is located at the output end of the MO section 120 and extends at least partially into the MO section 120, with the laser cavity of the MO section 120 defined by the FBG 150 and a cleaved back facet 102 of the chip at the other end of the MO section 120, with the back facet 102 preferably having a high-reflection (HR) coating 121 as known in the art so as to reflect back into the laser cavity most or all of the light generated in the MO section 120. Laser light generated in the active layer 115 of the MO section resonates between the HR facet coating 121 and the DFB grating 150, with the DFB grating 150 providing the desired wavelength selectivity. Some of the generated light passes through the DFB grating 150 into the PA section 130 as the laser light 117 and propagates towards an output end thereof. In one embodiment, the output end of the PA section 130 terminates at the distal second edge 103 of the chip, which forms an output face of the MOPA device 100. In a preferred embodiment, the output face 103 has an anti-reflection coating, and preferably an ultra-low-reflectivity antireflection (UAR) coating 131 to reduce back-reflections into the waveguide as known in the art of semiconductor amplifiers. The laser light 117 is amplified in a single pass through the PA section 120 and exits the chip via the UAR-coated face 103 as the output light 161.

In some embodiments, which are referred to herein as the full-length DFB, the DFB grating 150 extends through the whole length of the MO section 120 to the HR-coated back face 102. One potential disadvantage of the full-length DFB design is the existence of two nearly symmetrical DFB modes, which may in such designs have about equal mode loss, which may in turn result in an undesirable effects related to a competition between the two DFB mode, such as kinks in the power (P)-current (J) characteristics. As a result, the yield of kink-free devices related to the DFB mode competition can be as low as 50% for the full-length DFB design.

Accordingly, in the embodiment of FIGS. 2-4, which may be referred to as the partial-length DFB design, the FBG grating 150 extends only partially into the MO section 120 so that the grating length $L_g$ is less than the total length $L_{MO}$ of the MO section 120, which may be defined by the length of the first contact 111. One advantage of having the DFB grating extending only partially into the MO section is that a partial-length DFB grating breaks the loss symmetry between the two DFB modes, thereby suppressing the undesirable DFB mode competition and reducing the likelihood of kinks in the P(J) curves, so that the yield of kink-free DFB MOPA lasers is increased. Although the kink-free yield increases as the relative length of the DFB grating is reduced, the feedback efficiency and/or wavelength selectivity of the DFB grating is generally reduced when the grating length is decreased, with an optimal value of the relative length of the grating depending on particularities of the grating and laser design, such as the length of the grating cavity $L_{MO}$ and the grating strength parameter κ. The grating length optimization could be different for designs with $1^{st}$ order and 2d order gratings, with optimum grating length being shorter for the $1^{st}$ order grating. By way of example, in some embodiments the length of the DFB grating 150 may be between about 10% and about 70% of the total length of the MO section in the partial-length DFB embodiments, and preferably in the range of 30-50% for the $2^{nd}$ order gratings, and 10-30% for the $1^{st}$ order gratings.

Furthermore, it may be beneficial to have the DFB grating 150 located somewhat away from the PA section 130 for reducing a thermal crosstalk from the PA section 130 at the location of the DFB grating 150, and its effect on the laser wavelength. For example, in some embodiments the DFB grating 150 may be spaced apart from the PA section 130, as defined by the proximate end of the second electrode 113, by about 10-40% of the MO length, or about 50-500 μm.

The central wavelength λ of the output light 161 of the MOPA laser 100 is determined by the lasing wavelength of the DFB laser of the MO section 120, which is in turn dictated by the pitch of the grating 150 and by its refractive index. The refractive index in the grating region, in turn, depends on the temperature of the DFB grating 150, and to a lesser extent, the carrier concentration in the grating region. The temperature of the grating 150 is a function of the temperature of a laser case or submount that the MOPA chip is bonded to, the junction temperature of the MO section 120, which is driven by heat from the MO current injection, and by cross-talk of the heat from the PA section 130 that is being conducted to the MO section 120.

In operation, the output power of the MOPA device P, i.e. the optical power of the output light 161, is controlled primarily by the PA current $J_{PA}$ that is injected into the PA section 130 through the PA contact 113, so that an increase in the output optical power P, if such an increase is desired, is effected by increasing the PA current $J_{PA}$. However, as the current injected into the PA section 130 is increased to increase the output power P of the MOPA laser 100, the DFB grating 150 in the MO section 120 is inadvertently heated via thermal conduction from the PA section 130. This heating of the DFB grating 150 due to the thermal cross-talk from the PA section 130 shifts the reflectivity spectrum of the DFB grating 150, resulting in an undesirable change in the laser wavelength λ.

One aspect of the present disclosure provides a method of operating the DFB MOPA laser 100 so as to eliminate, or at least lessen the undesirable dependence of the laser wavelength λ on the output power P by electrically driving the MO and PA sections of the DFB MOPA 100 in such a way so as to compensate for the thermal cross-talk from the PA section 130 into the region of the MO section 120 of the device where the DFB grating 150 is located.

Figure 5:
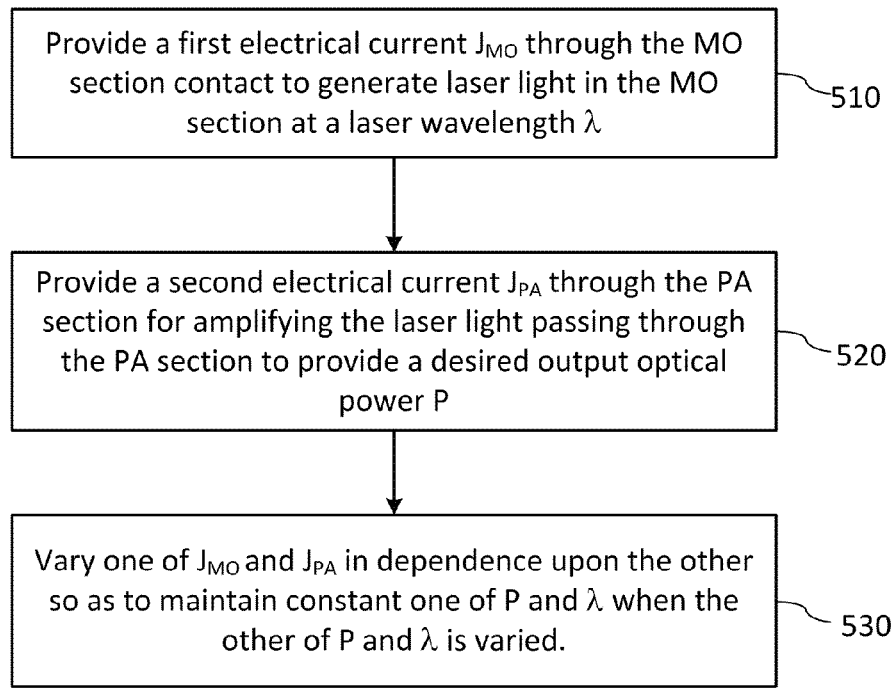
FIG. 5 is a flowchart illustrating an embodiment of a method of the present invention for controlling the output power and wavelength of the DFB MOPA laser of FIGS. 2-4.

With reference to FIG. 5, the method may be described as including the following general steps:

a) at 510, providing a first electrical current $J_{MO}$ through the MO contact 111 to generate light 117 in the MO section 120 at a laser wavelength λ;

b) at 520, providing a second electrical current $J_{PA}$ through the PA contact 112 to induce optical gain in the active layer 115 of the PA section 130 for amplifying the light 117 passing through the PA section 150; and, c) at 530, varying one of the first and second electrical currents $J_{MO}$, $J_{PA}$ in dependence upon the other of the first and second electrical currents $J_{MO}$, $J_{PA}$ so as to maintain constant one of an optical power P and the wavelength λ of the output light 161 when the other one of the optical power P and the wavelength λ is varied.

According to one embodiment of the method, it includes suitably varying the current $J_{MO}$ through the MO section in dependence upon $J_{PA}$ when the PA current $J_{PA}$ is changed, so as to compensate for the change in the DFB grating temperature induced by the thermal cross-talk from the PA section 130, and to maintain the laser wavelength λ constant.

Figure 6:
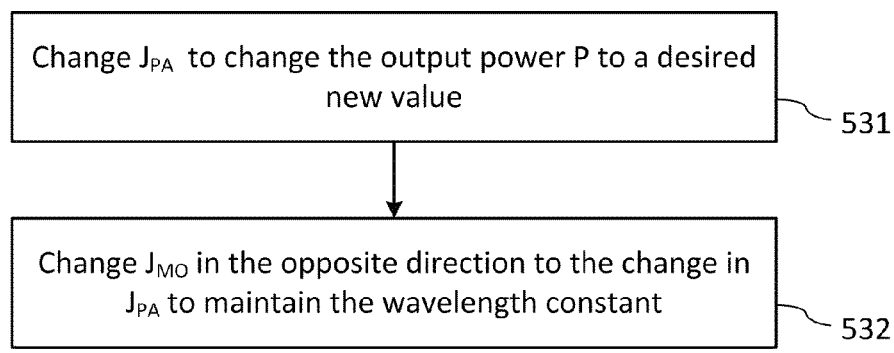
FIG. 6 is a flowchart illustrating the step of varying MO and PA currents for controlling the laser wavelength in an embodiment of the method of FIG. 5.

Referring to FIG. 6, in this embodiment step 530 of the method of FIG. 5 includes step 531 wherein the second electrical current $J_{PA}$ is changed to change the output power P to a desired new value, and step 532 wherein the first electrical current $J_{MO}$ is changed in an opposite direction to the change in $J_{PA}$ in step 531 so as to offset the change in heating of the DBF grating 150 arising from the changed PA current $J_{PA}$, and to maintain the wavelength λ of the output light 161 constant. It will be appreciated that changing $J_{MO}$ in an opposite direction to $J_{PA}$ means decreasing $J_{MO}$ when $J_{PA}$ is increased, and increasing $J_{MO}$ when $J_{PA}$ is decreased. Preferably, steps 531 and 532 are performed simultaneously so as to lessen or preferably eliminate instantaneous variations of the laser wavelength λ during the change in the optical power P.

Figure 7:
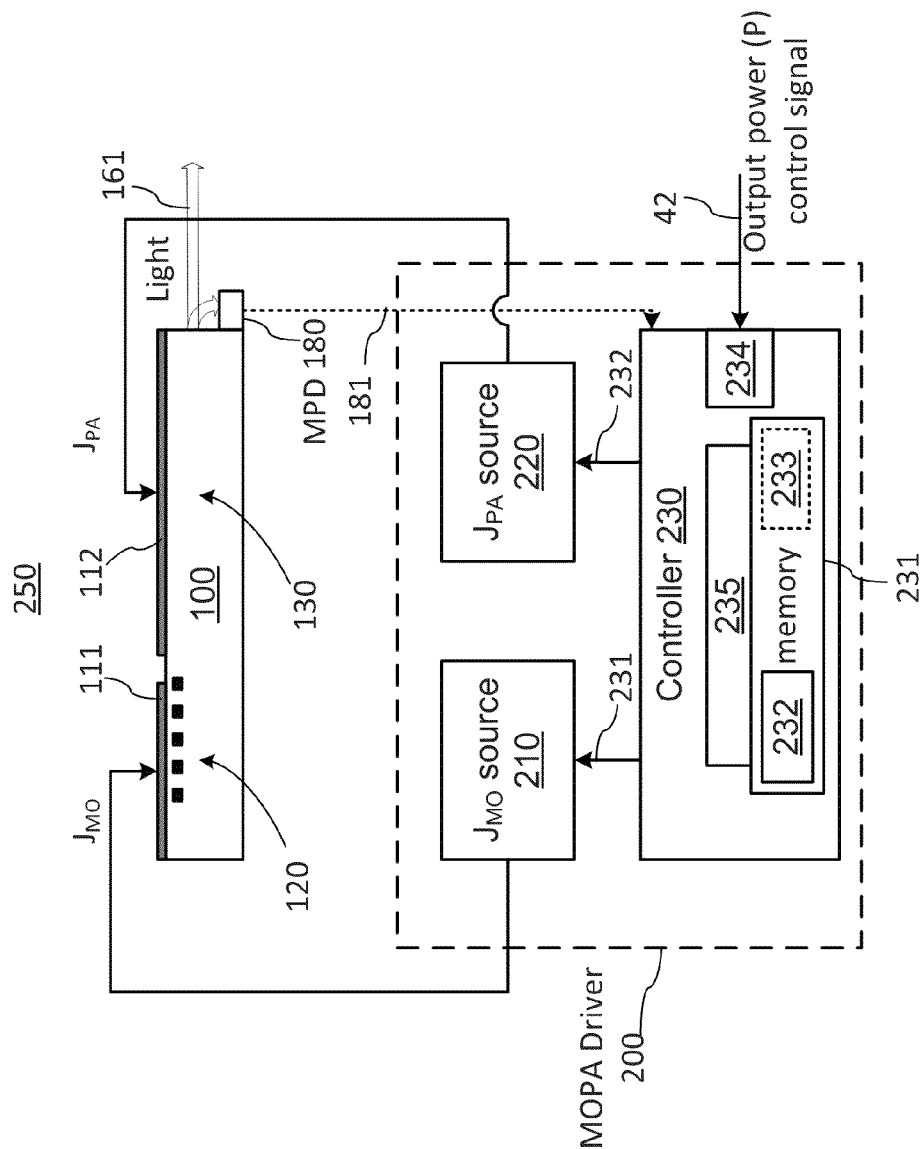
FIG. 7 is a schematic block diagram of an electrical driver circuit for driving the DFB MOPA device and for controlling the output wavelength thereof according to the present disclosure.

Referring now to FIG. 7, there is illustrated a MOPA device 250 configured for implementing one or more embodiments of the method of the present disclosure. The MOPA device 250 includes the DFB MOPA laser 100, or a variant thereof, and further includes an electronic MOPA driver 200 that electrically connects to the first and second contacts 111, 112 of the MOPA laser 100 for driving the first electrical current $J_{MA}$ through the MO section 120 and the second electrical current $J_{PA}$ through the PA section 130. The first electrical current $J_{MO}$ is selected so as to be sufficient to initiate lasing in the MO section 120 at the laser wavelength λ, while the second electrical current $J_{PA}$ is selected for providing a desired degree of optical amplification in the PA section 130. In the shown embodiment, the driver 200 includes a controller 230, and two controlled current sources 210 and 220 for generating the MO current $J_{MO}$ and the PA current $J_{PA}$, respectively, in response to current control signals 231, 232 received from the controller 230. The controller 230 is configured for varying one of the first and second electrical currents $J_{MO}$, $J_{PA}$ generated by the current sources 210, 220 in dependence upon the other of the first and second electrical currents $J_{MO}$, $J_{PA}$ so as to control one of the output optical power P and the wavelength λ of the output light 161 when the other of the optical power P or the wavelength λ is varied.

In one embodiment, the controller 230 is configured for changing the MO current $J_{MO}$ in the opposite direction to changes in the PA current $J_{PA}$, when $J_{PA}$ is changed to increase or decrease the output optical power P. For example when the PA current $J_{PA}$ is increased so as to increase the output optical power P to a desired higher level, the MO current $J_{MO}$ is simultaneously decreased, for example in accordance with a pre-defined rule or function $J_{MO}(J_{PA})$ that gives $J_{MO}$ values in dependence on $J_{PA}$ values, so as to reduce heating of the DFB grating 150 due to the MO current $J_{MO}$ to compensate for an increased thermal flow to the grating 150 due to the thermal crosstalk from the PA section 130.

Figure 8:
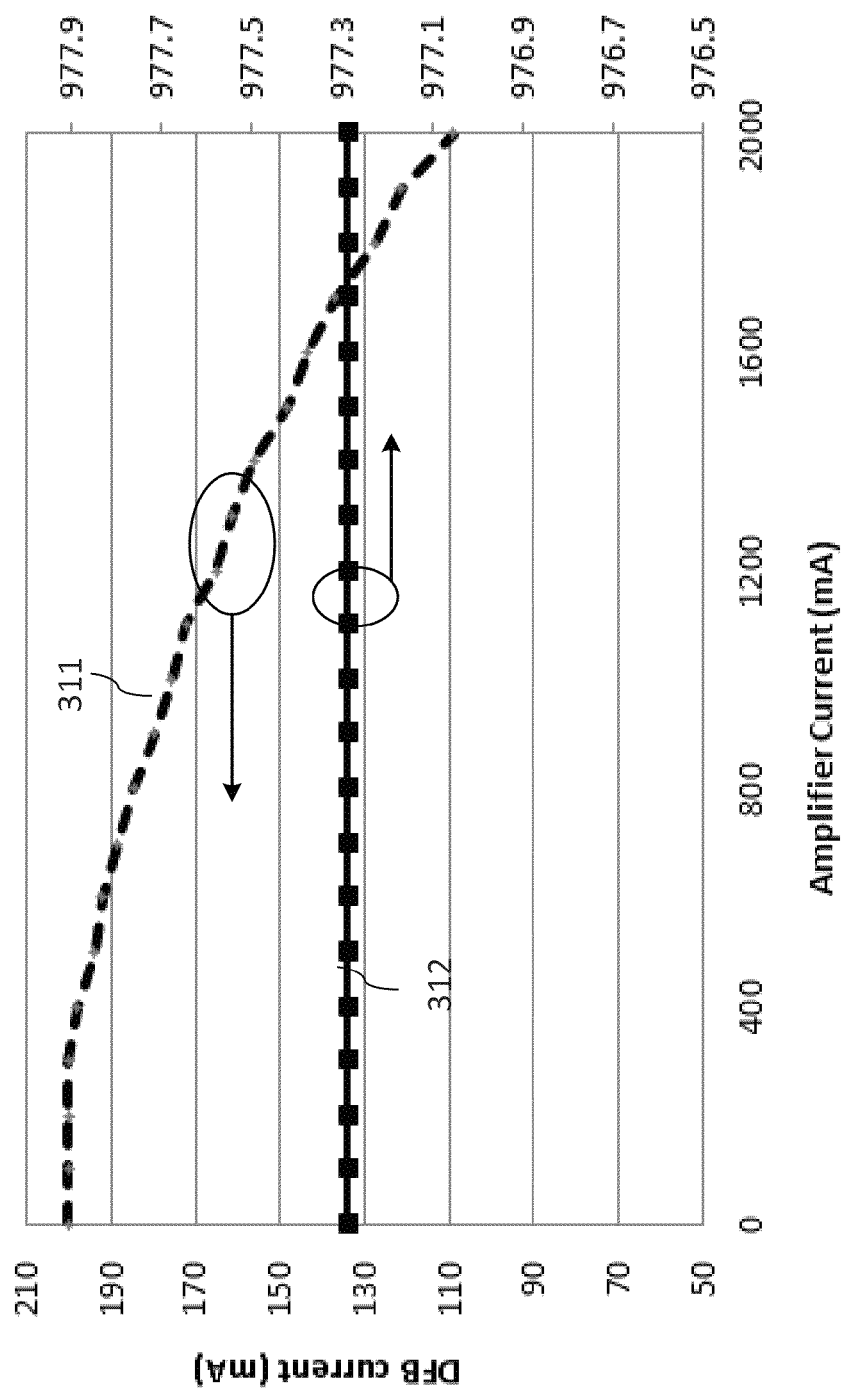
FIG. 8 is a graph illustrating an experimental dependence of the MO current JMO on the PA current JPA that maintains the laser wavelength constant for various levels of the output optical power.

With reference to FIG. 8, there is illustrated an experimental dependence $J_{MO}(J_{PA})$ 311 of the MO current $J_{MO}$ on the PA current $J_{PA}$ that maintains the laser wavelength λ at a constant level 312 of approximately 977.3 nm for an exemplary MOPA laser 100 with a layer structure typical for a 980 nm pump laser, with the MO length of 1 mm and PA length of 4 mm. As the amplifier current $(J_{PA})$ is increased from 0 ma to 2000 mA, the wavelength-maintaining DFB-MO current $(J_{MO})$ is decreased from 200 mA to 110 mA.

Tuning back to FIG. 7, in one embodiment the dependence $J_{MO}(J_{PA})$ that provides for a constant output wavelength λ is obtained for each MOPA laser 100 at a device calibration stage, and is then saved in memory 231 of the controller 230, for example in the form of a look-up table (LUT) 232 that individually associates a plurality of $J_{PA}$ values with a plurality of $J_{MA}$ values, so that each $J_{PA}$ value is associated with a corresponding $J_{MO}$ values, for example as defined by the $J_{MO}(J_{PA})$ dependence 311 obtained at device calibration.

In one embodiment, memory 231 further stores information 233 defining a dependence $P(J_{PA})$ of the output optical power P on the PA current $J_{PA}$ for the MO current $J_{MO}$ according to LUT 232. The $P(J_{PA})$ dependence 233 may be stored in the form of a second LUT, or any other suitable form as known in the art.

In one embodiment, the controller 230 has an interface 234 for receiving from a user a control signal 42 specifying a desired output optical power value P and/or a desired laser wavelength λ. Controller 230 further includes software or hardware logic 235 for accessing LUT 232 to obtain a value of the PA current $J_{PA}$ corresponding to the desired power P and/or a desired wavelength λ, and accessing LUT 231 to obtain a value of the MO current $J_{MO}$ corresponding to the selected $J_{PA}$, and for sending corresponding MO and PA current control signals 321, 322 to the controlled current sources 210, 220 for generating the MO and PA currents of the selected values.

In one embodiment, the MOPA device 250 further includes a monitoring photodiode (MPD) 180 that is disposed to receive a small portion of the output light 161 and is electrically connected to the controller 230 to provide it with an electrical signal 181 that is indicative of the optical power P of the output light 161. The controller 230 uses the MPD signal 181 to monitor changes in the output power, as generally known in the art. The MPD signal 181 may also be used to generate and/or update $J_{PA}(P)$ information 233 stored in memory 231. MPD 180 may be either external or internal to the MOPA laser 100. For example, it can be formed within the MOPA chip and coupled to the MOPA waveguide 140 using a waveguide tap as known in the art, or may be attached to the MOPA chip or a MOPA housing near the output facet 103 to receive a portion of the output light that is scattered from coupling optics.

As one skilled in the art will appreciate, a same value of the output optical power P may be obtained with different combinations of the $J_{PA}$ and $J_{MO}$ values. In one embodiment, the selection of specific $J_{PA}$ and $J_{MO}$ values for a given P may be performed accounting for a target operating power range $[P_{min}, P_{max}]$ wherein the output optical power may vary during the device operation. Here, $P_{min}$ and $P_{max}$ are target maximum and minimum values, respectively, of the optical power P of the output light 161. The procedure should ensure that for the output optical power P at the high end $P_{max}$ of the target power range, when the MO current $J_{MO}$ is at its lowest value to maintain constant the DFB temperature and thus the wavelength, $J_{MO}$ still comfortably exceeds the lasing threshold $J_{th}$. In one embodiment it may include i) setting the MO current $J_{MO}$ to its minimal desired value $J_{MOmin}$, ii) determining $J_{PA}$ that provides the target maximum output power $P_{max}$, and iii) reducing the $J_{PA}$ while measuring the wavelength λ and the output power P of the output light 161, and, for each reduced $J_{PA}$, increasing $J_{MO}$ to a value that keeps the wavelength λ constant, and recording the corresponding value of the output optical power P. The procedure results in a three-column table of $(J_{PA}, J_{MO}, P)$ values that correspond to a particular output wavelength λ, which can be used to generate LUTs 232, 233.

Advantageously, the method of the present disclosure also enables to independently control the output wavelength λ while also controlling the output power P. By way of example, since the DFB laser wavelength depends on its temperature, and therefore, current, a value of the MO current $J_{MO}$ corresponding to a particular P, such as a minimum value $J_{MOmin}$ of the MO current $J_{MO}$ corresponding to $P=P_{max}$, may be selected so as to provide a desired value of the wavelength λ, and the control signal 42 may be in the form of a wavelength request signal. Accordingly, the LUTs 232, 233 may store multiple sets of $(J_{PA}, J_{MO}, P)$ triplets, each set for a specific value of the output wavelength λ.

It will be appreciated that LUTs 232, 233 may be in the form of a common wavelength-specific LUT that stores values of the first and second electrical currents $J_{MO}, J_{PA}$ for a plurality of laser wavelength values λ and one or more output power values P, and the method may then include adjusting the first and second electrical currents to tune the laser wavelength λ to a requested wavelength value in response to the wavelength request signal 42 using the look-up table.

Furthermore, for each given value $P \in [P_{min}, P_{max}]$ of the output optical power from a set of stored P values spanning from $P_{max}$ to $P_{min}$, there may exist a plurality of $(J_{MO}, J_{PA})$ pairs that correspond to different values of the laser wavelength λ, and therefore the output wavelength λ of the MOPA laser 100 may be tuned while keeping the output optical power P constant. Accordingly, the method may include simultaneously varying the first and second electrical currents $J_{MO}, J_{PA}$ in opposite directions so that when the first electrical current $J_{MO}$ is changed for changing the wavelength of the output light, the second electrical current $J_{PA}$ through the PA section is changed so at to maintain constant the output optical power P. Memory 231 may store one or more sets of $(J_{PA}, J_{MO})$ value pairs, each corresponding to a specific value of the output optical power P but different values of the wavelength λ, to assist in the wavelength tuning It will be appreciated that various elements and blocks of the MOPA driver 200 may be embodied using conventional hardware circuits and devices. For example, electrical current sources that are controlled by digital or analogue signals and are capable of outputting electrical currents in the range of 0 to about 1 A and above are known in the art and could be used as the current sources 210 and 220. The controller 230 may be embodied using a suitable digital processor such as a microcontroller or a programmable logic circuit such as an FPGA. Accordingly, control logic 235 can be embodied either in software or using hardware logic circuits. Memory 231 may be embodied using on-board processor memory such as RAM and non-volatile memory devices. The user interface 234 may be embodied using any combination of one or more interface means such as a network interface, a display, a keyboard, a pointing device, a knob, etc., as known in the art.

It will further be appreciated that various modification of the general design of the monolithic DFB MOPA laser 100 with a DFB grating in the MO section and separate individually-controlled pumping of MO and PA sections are possible within the confines of the present invention.

Figure 9:
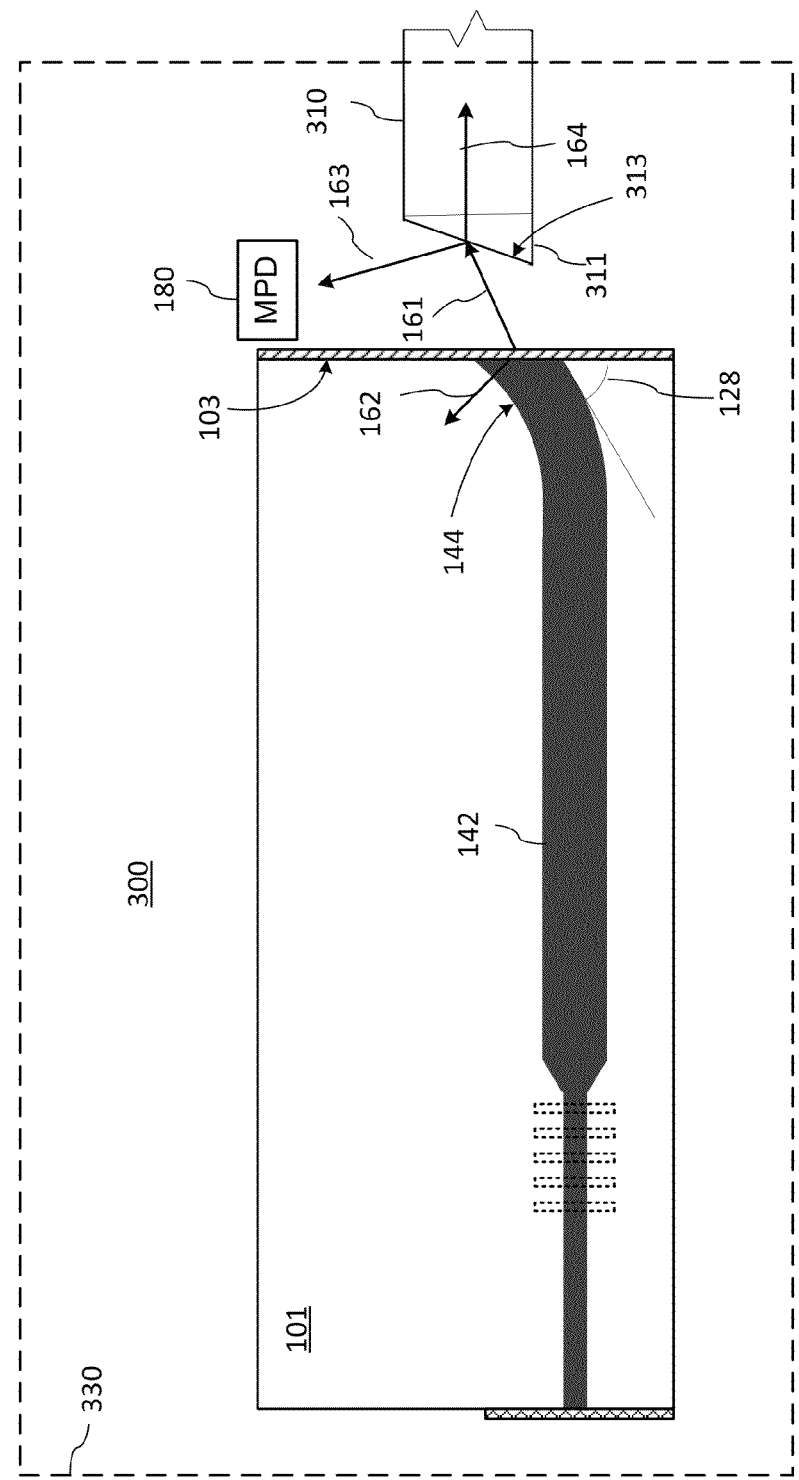
FIG. 9 is a plan view of an embodiment of the monolithic DFB MOPA laser of FIG. 2 with a waveguide bend in the power amplifier section.

For example, FIG. 9 illustrates a MOPA laser 300, which is an embodiment of the MOPA laser 100 wherein the PA waveguide 140 is bent so as to terminate at the output facet 103 of the laser chip at an angle 128, which is advantageous for reducing back reflections from the facet 103 back into the waveguide. When the output portion of the PA waveguide is slanted relative to the facet 103 as illustrated in the figure, light 162 reflected from the output facet 103 is directed away from the chip. The angle 128 is preferably at least 2 degrees, or more preferably between 2 and 10 degrees. In one embodiment, the bent portion 144 of the waveguide may extend over the whole length of the PA waveguide 142. By way of example, in one exemplary embodiment a 4 mm long PA waveguide 142 is curved along a circular path with a radius of curvature of 76 mm.

Similarly to conventional pump lasers, the DFB MOPA lasers 100, 300 may be packaged in a housing that also includes a fiber-optic pigtail optically coupled to the MOPA to receive the output light 161. FIG. 9 illustrates one such embodiment, which utilizes a fiber pigtail 310 having an angle-chisel lens (ACL) 311 at the proximate to the MOPA laser end thereof to reduce undesirable external optical feedback from the fiber tip back into the MOPA laser. The light-receiving face 313 of the ACL 311 is slanted at an angle of, for example, 2-10 degrees to the fiber core to direct a portion 163 of the MOPA light 161 that is reflected from the fiber face 313 further away from the waveguide 142. The DFB MOPA 300 and the fiber pigtail 310 are affixed to a device housing 330, which may fully enclose the DFB MOPA 300 and fix the light-receiving end of the fiber pigtail 310 in an optimal position for maximizing light 164 that is coupled from the MOPA waveguide 142 into the fiber-optic pigtail 310. In one embodiment, the MPD 180 may be positioned within the housing 330 to receive light 163 reflected from the ACL 311.

Figure 1:
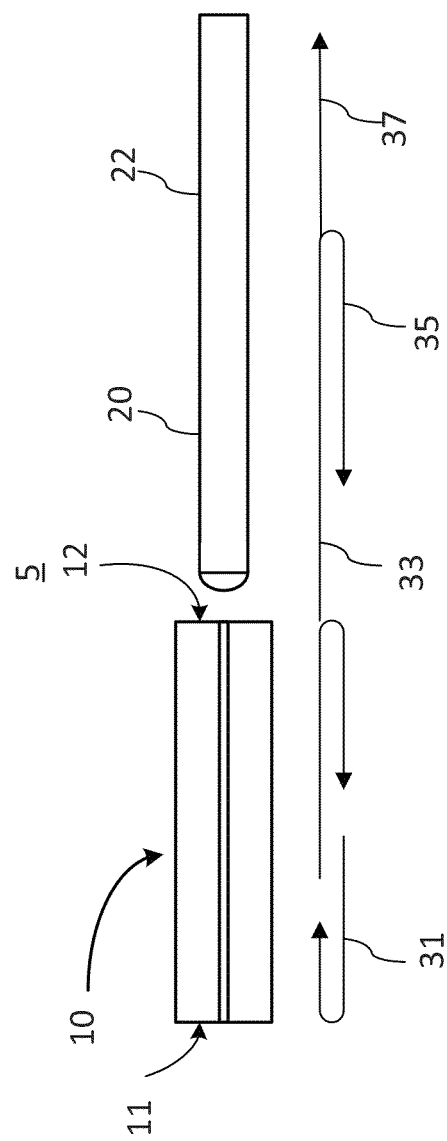
FIG. 1 is a schematic diagram illustrating a fiber-coupled semiconductor laser based optical pump source including an FBG in an output fiber pigtail for wavelength stabilization according to prior art.

One expected advantage of the DFB MOPA lasers of the present invention as compared to the conventional FP laser-external FBG design of FIG. 1 is a higher yield of package device having desired performance characteristics. Indeed, in conventional laser-FBG device the coupling efficiency between the laser chip and the optical fiber affects the ability of the FBG to 'lock' the laser wavelength, while in the DFB MOPA devices of the present disclosure the wavelength 'locking' performance is decoupled from the coupling efficiency between the laser chip and the optical fiber. Accordingly, the DFB MOPA devices should be less sensitive to the fiber-chip alignment than once using an external FBG, thereby enabling the fabrication of fiber-coupled arrays of DFB MOPA lasers 100 or 300 of the present disclosure with an acceptable yield. Thus, multi-chip, multi-output fiber pump packages may be enabled by the DFB MOPA architecture of the present disclosure.

Figure 10:
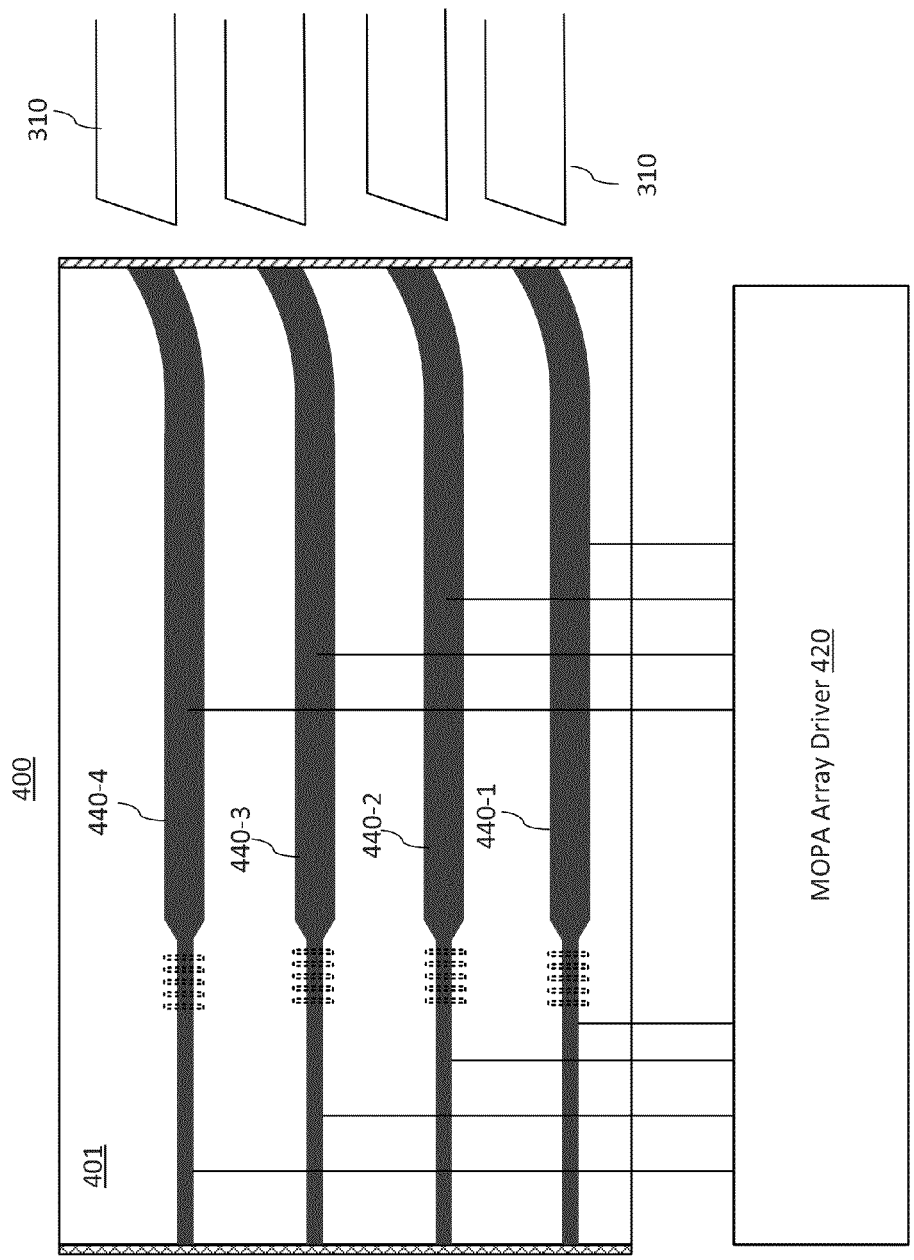
FIG. 10 is a schematic illustration of a fiber-coupled DFB MOPA laser array in a plan view.

With reference to FIG. 10, there is illustrated an exemplary embodiment of a DFB MOPA laser array 400, which includes a plurality of DFB MOPA structures 440 of the type illustrated in FIG. 7 formed within or upon a same substrate 401, each coupled to its own fiber-optic pigtail 310 for providing its own output beam of light, and having a DFB MO section and a PA section that are separately pumped. Although four DFB MOPA waveguides 440 are shown, which are labeled in the figure with reference numerals '440-1' through '440-4', other embodiments may include a greater number of individual DFB MOPA structures or fewer of them. In operation, the MOPA array 400 is driven by an electrical driver 420, which is electrically connected to the separate MO and PA electrical contacts of each of the MOPA structures 440 for varying electrical currents through the MO section thereof in dependence upon an electrical current through the PA section of the respective MOPA structure 440, so as to maintain constant a wavelength of the output light beam from the MOPA structure 440 when the optical power the output light beam changes. The MOPA array driver 420 for driving N MOPA laser structures 440 may be embodied substantially as a combination of N individual MOPA drivers 200 illustrated in FIG. 7, with 2N controlled current sources and N controllers 230 for controlling the pump current of individual MOPA structures 440, wherein all of the controllers 230 may be implemented using a single microcontroller.

Figure 11:
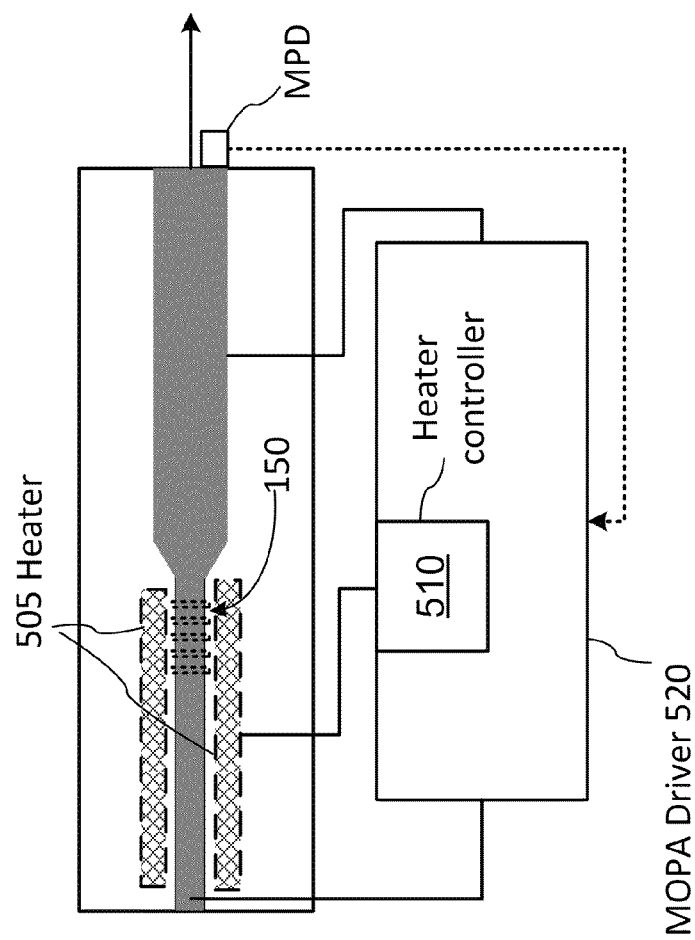
FIG. 11 is a schematic diagram illustrating an embodiment of the MOPA device of FIG. 7 with a heater in the MO section.

Turning now to FIG. 11, there is illustrated an embodiment of the DFB MOPA device of FIG. 7, which includes a heater 505 that is disposed in the MO section of the MOPA laser over or in the vicinity of the DFB grating 150 for heating thereof, and further includes a heater controller 510 within a MOPA driver 520. The heater 505 in combination with the heater controller 510 may be used to directly control the temperature in the MO section of the laser, and in particular the temperature in the region of the DFB grating 150 of the MO section, thereby controlling the lasing wavelength. The addition of the heater element may be especially useful for devices operating without a thermal-electrical cooler (TEC) in uncontrolled temperature environments where a large temperature swing, for example from −5 C to +75 C, must be accommodated, and provide additional means for controlling the laser wavelength λ, either in combination with the aforedescribed control of the injection current $J_{MO}$ through the MO section, or without the MO current control.

Figure 12:
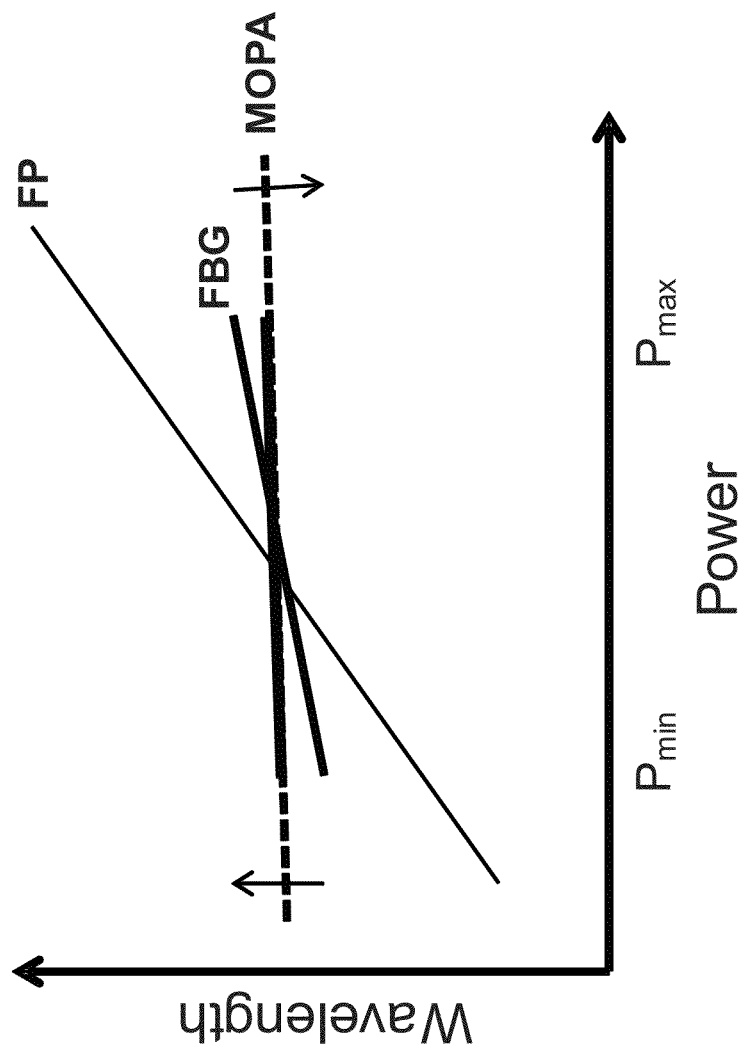
FIG. 12 is a graph illustrating the laser wavelength versus output optical power for a typical Fabry-Perot (FP) laser diode, a typical FBG-stabilized laser diode (FBG), and the DFB MOPA device of the present disclosure.

Advantageously, the DFB MOPA device of the present invention and the method of controlling thereof, which are described hereinabove with reference to exemplary embodiment, enables a much better 'locking' of the laser wavelength to a specific fixed value, than commercial pump laser, as illustrated in FIG. 12. Indeed, while the lasing wavelength of conventional Fabry-Perot diode lasers typically varies by several nanometers when going from low to high power of an operating power range ($P_{min}$, $P_{max}$), and the lasing wavelength of FBG-stabilized Fabry-Perot diode lasers typically varies by ~0.2 nanometers over a typical operating power range, the wavelength of the DFB MOPA laser of the present disclosure may be controlled to stay substantially fixed up to a much higher accuracy, depending on the controller implementation and the accuracy and resolution of the saved constant-λ $P(J_{MO}, J_{PA})$ characteristic.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

We claim:

1. A master oscillator-power amplifier (MOPA) device, comprising:
   a monolithic MOPA chip comprising a semiconductor substrate and at least one MOPA structure formed upon the substrate, the at least one MOPA structure comprising:
   a master oscillator (MO) section comprising a single spatial mode DFB laser structure for generating laser light, the single spatial mode DFB laser structure comprising a Bragg grating for providing a distributed optical feedback therein and for defining a laser wavelength, the MO section comprising a first electrical contact; and a power amplifier (PA) section comprising a semiconductor amplifier structure optically following the single spatial mode DFB laser structure and integrally coupled thereto for amplifying the laser light and for providing output light in a single spatial mode, the PA section comprising a second electrical contact, wherein the first and second electrical contacts are electrically separate from each other for separately pumping the MO and PA sections of the MOPA device with first and second electrical currents; and a MOPA driver electrically connected to the first and second electrical contacts for driving the first electrical current through the MO section and the second electrical current through the PA section to initiate lasing in the MO section at the laser wavelength while providing optical amplification in the PA section, wherein the MOPA driver comprises a controller that is configured to vary the first electrical current in dependence upon the second electrical current so that when the second electrical current through the PA section is increased for increasing the optical power of the output light, the first electrical current through the MO section is decreased so at to maintain the laser wavelength constant.

2. The MOPA device of claim 1, wherein the controller comprises a memory storing information for determining values of the first and second currents that correspond to a same value of the laser wavelength.

3. The MOPA device of claim 1, wherein the MO section comprises a reflective back end and an output end facing the PA section, and wherein the Bragg grating is disposed under the first electrical contact at the output end of the MO section and extends only partially into the MO section for forming a laser cavity with the reflective back end of the MO section.

4. The MOPA device of claim 3 wherein the Bragg grating has a length that does not exceed 70% of the length of the MO section.

5. The MOPA device of claim 4 wherein the length of the Bragg grating is in the range of 10% to 50% of the length of the MO section.

6. The MOPA device of claim 1, wherein the MOPA chip has a high-reflection (HR) back facet defining a reflective back end of the MO section and an output facet defining an output end of the PA section, and wherein the MOPA structure comprises a planar optical waveguide extending from the HR back facet through the MO and PA sections to the output facet for guiding the laser light generated in the MO section through the PA section to the output end thereof, and wherein the planar optical waveguide comprises an active waveguide layer structure disposed over the substrate.

7. The MOPA device of claim 6 wherein the planar optical waveguide is bent in the PA section so as to terminate at the output facet at least 2 degree angle relative to a normal to the output facet for lessening back reflections into the waveguide.

8. The MOPA device of claim 6, wherein the width of the planar optical waveguide in the MO section is in the range of 2 um to 5 um, and wherein the width of the planar optical waveguide at the output facet does not exceed about 10 um.

9. The MOPA device of claim 8, further comprising a fiber-optic pigtail optically coupled to the output end of the PA section and having an angle chisel lens formed at a proximate end thereof for reducing optical feedback into the MOPA structure.

10. The MOPA device of claim 1, further comprising an electrical heater disposed in the MO section of the device for heating the DFB grating, and wherein the driver comprises a circuit for controlling an electrical current through the heater so as to control the laser wavelength by changing a temperature of the Bragg grating when the second current is changed for changing the output optical power.

11. The MOPA device of claim 1, wherein the at least one MOPA structure comprises a plurality of MOPA structures disposed upon the substrate for providing a plurality of output optical beams, each of the plurality of MOPA structures comprising a MO section and a PA section having spaced apart electrical contacts for separate electrical pumping thereof for providing independent wavelength and optical power control for each MOPA structure.

12. The MOPA device of claim 11, wherein the driver is electrically connected to the first and second electrical contacts of each of the MOPA structures for varying electrical currents through the MO section thereof in dependence upon an electrical current through the PA section of the respective MOPA structure, so as to maintain constant a wavelength of the output light beam from the MOPA structure when the optical power of the output light beam changes.

13. A method of controlling the wavelength of a monolithic master oscillator-power amplifier (MOPA) device, the method comprising:

providing a MOPA device comprising a DFB laser master oscillator (MO) section optically coupled to a single-spatial-mode power amplifier (PA) section and having separate electrical contacts in MO and PA sections enabling separate control of electrical current injection into the MO and PA sections of the MOPA device, wherein the MO and PA sections are in thermal contact with each other;

providing a first electrical current through the MO electrical contact to generate light in the MO section at a laser wavelength;

providing a second electrical current through the PA electrical contact for amplifying the light passing through the PA section; and, varying the first and second electrical currents in opposite directions so that when the second current through the PA section is increased for increasing the output optical power, the first electrical current through the MO section is decreased for compensating the effect of the increased second current on a temperature in a DFB region of the MO section, so as to maintain the laser wavelength constant while the output optical power is varied.

14. The method of claim 13, wherein the step of varying the first and second electrical currents comprises using a digital controller to control the first current in dependence on the second current according to a pre-defined rule.

15. The method of claim 14, comprising using a look-up table stored in memory of the controller to determine a value of the first current that keeps the laser wavelength constant when the second current is changed to a new value.

16. A method of controlling the wavelength of a monolithic master oscillator-power amplifier (MOPA) device, the method comprising:

providing a MOPA device comprising a DFB laser master oscillator (MO) section optically coupled to a single-spatial-mode power amplifier (PA) section and having separate electrical contacts in MO and PA sections enabling separate control of electrical current injection into the MO and PA sections of the MOPA device, wherein the MO and PA sections are in thermal contact with each other;

providing a first electrical current through the MO electrical contact to generate light in the MO section at a laser wavelength;

providing a second electrical current through the PA electrical contact for amplifying the light passing through the PA section; and, varying the first and second electrical currents so that when the first electrical current is changed for changing the wavelength of the output light, the second electrical current through the PA section is changed so at to maintain constant the output optical power.

17. A method of controlling the wavelength of a monolithic master oscillator-power amplifier (MOPA) device, the method comprising:

providing a MOPA device comprising a DFB laser master oscillator (MO) section optically coupled to a single-spatial-mode power amplifier (PA) section and having separate electrical contacts in MO and PA sections enabling separate control of electrical current injection into the MO and PA sections of the MOPA device, wherein the MO and PA sections are in thermal contact with each other providing a first electrical current through the MO electrical contact to generate light in the MO section at a laser wavelength;

providing a second electrical current through the PA electrical contact for amplifying the light passing through the PA section;

varying one of the first and second electrical currents in dependence upon the other of the first and second electrical currents so as to maintain constant one of an output optical power of the PA section and the laser wavelength when the other of the output optical power and the laser wavelength is varied;

providing a controller electrically connected to the MO and PA sections of the MOPA device for controlling the first and second electrical currents, the controller comprising a computer-readable memory storing a look-up table containing values of the first and second electrical currents for a plurality of laser wavelength values and one or more output power values; and responsive to a wavelength request signal, adjusting the first and second electrical currents to tune the laser wavelength to a requested wavelength value using the look-up table.

\* \* \* \* \*